United States Patent
Krishnan et al.

(10) Patent No.: US 6,495,887 B1
(45) Date of Patent: Dec. 17, 2002

(54) ARGON IMPLANTATION AFTER SILICIDATION FOR IMPROVED FLOATING-BODY EFFECTS

(75) Inventors: Srinath Krishnan, San Jose, CA (US); Witold P. Maszara, Morgan Hill, CA (US); Matthew S. Buynoski, Palo Alto, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 5 days.

(21) Appl. No.: 09/621,290

(22) Filed: Jul. 20, 2000

Related U.S. Application Data

(60) Provisional application No. 60/210,511, filed on Jun. 9, 2000.

(51) Int. Cl.$^7$ .................................... H01L 31/0392
(52) U.S. Cl. ................... 257/347; 257/408; 257/59; 257/63
(58) Field of Search ................ 257/59, 63, 66, 257/347–360

(56) References Cited

U.S. PATENT DOCUMENTS

| | | | |
|---|---|---|---|
| 5,441,900 A | | 8/1995 | Bulucea et al. |
| 5,527,724 A | | 6/1996 | Brady et al. |
| 5,637,909 A | | 6/1997 | Nakajima et al. |
| 5,659,194 A | | 8/1997 | Iwamatsu et al. |
| 5,856,225 A | * | 1/1999 | Lee et al. .......... 438/291 |
| 5,861,330 A | | 1/1999 | Baker et al. |
| 5,920,104 A | * | 7/1999 | Nayak et al. ........ 257/408 |
| 6,023,088 A | * | 2/2000 | Son ................ 257/347 |

\* cited by examiner

*Primary Examiner*—David Nelms
*Assistant Examiner*—Dung A Le
(74) *Attorney, Agent, or Firm*—Amin & Turocy, LLP

(57) ABSTRACT

A method of forming a MOSFET device is provided including the steps of forming N$^-$ lightly doped source and drain extension regions in the top silicon layer, forming spacers above the N$^-$ lightly doped source and drain extension regions and forming N$^+$ source and N$^+$ drain regions in the top silicon layer. A silicide film is then provided over the drain and source regions and the spacers are removed. An ion implantation step is then performed to form damaged sidewall regions in the source body and drain body junction.

18 Claims, 6 Drawing Sheets

ARGON IMPLANTATION AFTER SILICIDATION FOR IMPROVED FLOATING-BODY EFFECTS

CROSS REFERENCE TO RELATED APPLICATIONS

This application claims the benefit of U.S. Provisional Patent Application Serial No. 60/210,511, filed Jun. 9, 2000, entitled ARGON IMPLANTATION AFTER SILICIDATION FOR IMPROVED FLOATING-BODY EFFECTS.

FIELD OF THE INVENTION

The present invention generally relates to the design of field effect transistors (FETS) and, more particularly, to a metal oxide silicon (MOS) transistor structure which facilitates mitigation of series resistance and floating body effects.

BACKGROUND OF THE INVENTION

As is known in the art, transistors such as metal oxide silicon (MOS) transistors, have been formed in isolated regions of a semiconductor body such as an epitaxial layer which was itself formed on a semiconductor, typically bulk silicon, substrate. With an n-channel MOS field effect transistor (FET), the body is of p-type conductivity and the source and drain regions are formed in the p-type conductivity body as $N^+$ type conductivity regions. With a p-channel MOSFET, the body, or epitaxial layer, is of n-type conductivity and the source and drain regions are formed in the n-type conductivity body as $P^+$ type conductivity regions. It has been suggested that the semiconductor body, or layer, be formed on an insulating substrate, or over an insulation layer formed in a semiconductor substrate. Such technology sometimes is referred to as Silicon-on-Insulator (SOI) technology. Silicon-on-Insulator MOS technologies have a number of advantages over bulk silicon MOS transistors. These advantages include: reduced source/drain capacitance and hence improved speed performance at higher-operating frequencies; reduced $N^+$ to $P^+$ spacing and hence higher packing density due to ease of isolation; and higher "soft error" upset immunity (i e., the immunity to the effects of alpha particle strikes).

Silicon-on-Insulator technology is characterized by the formation of a thin silicon layer for formation of the active devices over an insulating layer, such as an oxide, which is in turn formed over a substrate. Transistor sources in drains are formed by, for example, implantations into the silicon layer while transistor gates are formed by forming a patterned oxide and conductor (e.g. metal) layer structure. Such structures provide a significant gain in performance by having lower parasitic capacitance (due to the insulator layer) and increased drain current due to floating body charging effects (since no connection is made to the channel region and charging of the floating body provides access towards a majority of carriers which dynamically lower the threshold voltage, resulting in increased drain current). However, the floating body can introduce dynamic instabilities in the operation of such a transistor.

An SOI field effect transistor combines two separated immunity groups, generally formed by implantation, constituting the source and drain of the transistor with the general region (device body) between them covered by a thin gate insulator and a conductive gate. Typically no electrical connection is made to the channel region and therefore the body is electrically floating. Because the source and drain regions normally extend entirely through the thin silicon layer, the electrical potential of the body is governed by Kirchoff's current law, wherein the sum of the currents flowing into the body equals the sum of the currents flowing out of the body. Because the channel potential is dependent on the body voltage, the device threshold voltage varies as a function of the body voltage.

The boundaries between the channel region and the source and drain, respectively, form junctions which are normally reversed biased. Conduction in the channel region normally occurs immediately below the gate insulator in the region in which depletion can be controlled by a gate voltage. However, the junctions at the boundary of the source and drain also form a parasitic lateral bipolar transistor, which, in effect exists somewhat below the field effect transistor and may supplement desired channel current. On the other hand, the parasitic bipolar device cannot be controlled and under some bias conditions, the operation of the parasitic bipolar device may transiently dominate the operation of the field effect transistor and effectively occupy substantially the entire silicon layer at times when the channel current is not desired.

The parasitic bipolar transistor induces latch-up breakdown voltage and severely limits the maximum supply voltage at which SOI devices can operate. If the parasitic devices turn on, the SOI transistor cannot be switched by changing the gate bias. One approach for reducing the latch-up/breakdown effect have been based on reducing the electric field for a given drain bias (LDD approach). A method of implanting silicon impurity atoms such as argon, krypton or xenon has been employed to reduce the lifetime of minority carriers in the parasitic transistors, and hence reduce the gain of the parasitic transistors. This is known as implanting a minority carrier lifetime reducer (MCLR). Decreasing the lifetime of the junction minimizes the floating body effects by removing excess carriers, so that the carriers do not build up as fast in the body. As a result, the devices can be operated at a higher supply voltage resulting in improved performance.

Several limitations on miniaturization of field-effect transistors have been encountered. As a conduction channel is made small, several adverse effects on transistor performance occur such as series resistance and/or hot electron carrier effects.

The series resistance of an FET is a function of both the cross-sectional area and length of the conduction channel. It is desirable to limit the depth which the conduction channel extends into the substrate in order to limit the voltage which is needed to control the FET as well as to limit leakage and punch-through effects. However, the use of such shallow junctions causes the series resistance to increase. Series resistance must be maintained at a low value in order not to degrade the extrinsic transconductance of the FET. In general, the greater the extrinsic transconductance of the FET, the faster the circuit performance obtained. Low series resistance is often achieved by siliciding (i.e., forming a metal silicide at a metal-silicon interface) the source and drain or selectively depositing metal such as tungsten on the source and drain areas.

Conventionally, LDD, MCLR ion implantation and siliciding steps are all performed on a single device. However, conventional methods do not provide optimal results. In view of the above, it is apparent that there is a need in the art for a method of providing a device in which LDD, MCLR ion implantation and siliciding is performed such that better results as those available conventionally are achieved.

SUMMARY OF THE INVENTION

The present invention provides for a method for forming LDD regions, a silicide film layer and implanting a minority carrier lifetime reducer (MCLR) on a single device. Conventionally, MCLR implantation is performed prior to silicidation and after forming LDD regions. The MCLR implantation causes damage on the bottom edges of the source and drain, but due to the spacers being present fails to cause as much damage along the sidewalls, where the drain region and source region meet the body region and form parasitic transistors. In addition, the temperature annealing to form the silicide unanneals part of the damage caused by the MCLR implantation and as a result the MCLR implantation is not as effective. The present invention mitigates the aforementioned problems associated with conventional methods by performing a siliciding step prior to implanting the MCLR. In addition, after device formation, spacers used in forming drain and source regions are removed prior to step of implanting the MCLR implantation. The silicide acts as a natural mask and the step of implanting the MCLR implantation kills the lifetime along the sidewalls of the drain and source region.

Once aspect of the invention relates to a method of forming a MOSFET device. The method comprises the sequential steps of forming drain and source regions, forming at least one of a drain and source silicide film over at least one of the drain and source regions and forming at least one damaged sidewall region of the drain and source regions.

In another aspect of the invention, a method of forming an SOI NMOS transistor is provided. A SIMOX process is used to form a silicon base, an oxide layer between the base and a top silicon layer and an insulating oxide layer formed over the substrate. $N^-$ lightly doped source and drain extension regions are formed in the top silicon layer. Spacers are formed above the $N^-$ lightly doped source and drain extension regions. $N^+$ source and $N^+$ drain regions are formed in the top silicon layer, and at least one of a drain and source silicide film is formed over at least one of the drain and source regions. The spacers are removed and thereafter at least one damaged sidewall region of the drain and source regions is formed.

In yet another aspect of the invention, a method of forming a MOSFET device is provided. The method comprises the steps of forming $N^-$ lightly doped source and drain extension regions in the top silicon layer. Spacers are formed above the $N^-$ lightly doped source and drain extension regions. $N^+$ source and $N^+$ drain regions are formed in the top silicon layer and at least one of a drain and source silicide film is formed over at least one of the drain and source regions. The spacers are removed and thereafter at least one damaged sidewall region of the drain and source regions is formed.

In another aspect of the invention a MOSFET device is provided. The MOSFET device comprises a source region, a drain region, first lightly doped regions, the first lightly doped regions including a lightly doped source extension region and a lightly doped drain extension region and at least one damaged sidewall region at one of the source body junction and the drain body junction.

In yet another aspect of the invention a SOI NMOS device is provided. The SOI NMOS device comprises a silicon substrate and an insulating oxide layer formed over the substrate. A top silicon layer is formed over the insulating oxide layer and a gate formed over a portion of the top silicon layer. A gate oxide is formed between the gate and the top silicon layer. $N^-$ source and $N^+$ drain regions are formed in the top silicon layer and $N^-$ lightly doped source and drain extension regions are formed in the top silicon layer. Source damaged regions and drain damaged regions are formed in sidewalls of the $N^+$ source and $N^+$ drain regions, respectively. Source silicide film and drain silicide film layers are formed over the $N^+$ source and $N^+$ drain regions, respectively. The source silicide film and drain silicide film layer facilitate mitigating series resistance in the source and drain regions and the source damaged regions and drain damaged regions facilitate mitigating floating body effects.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
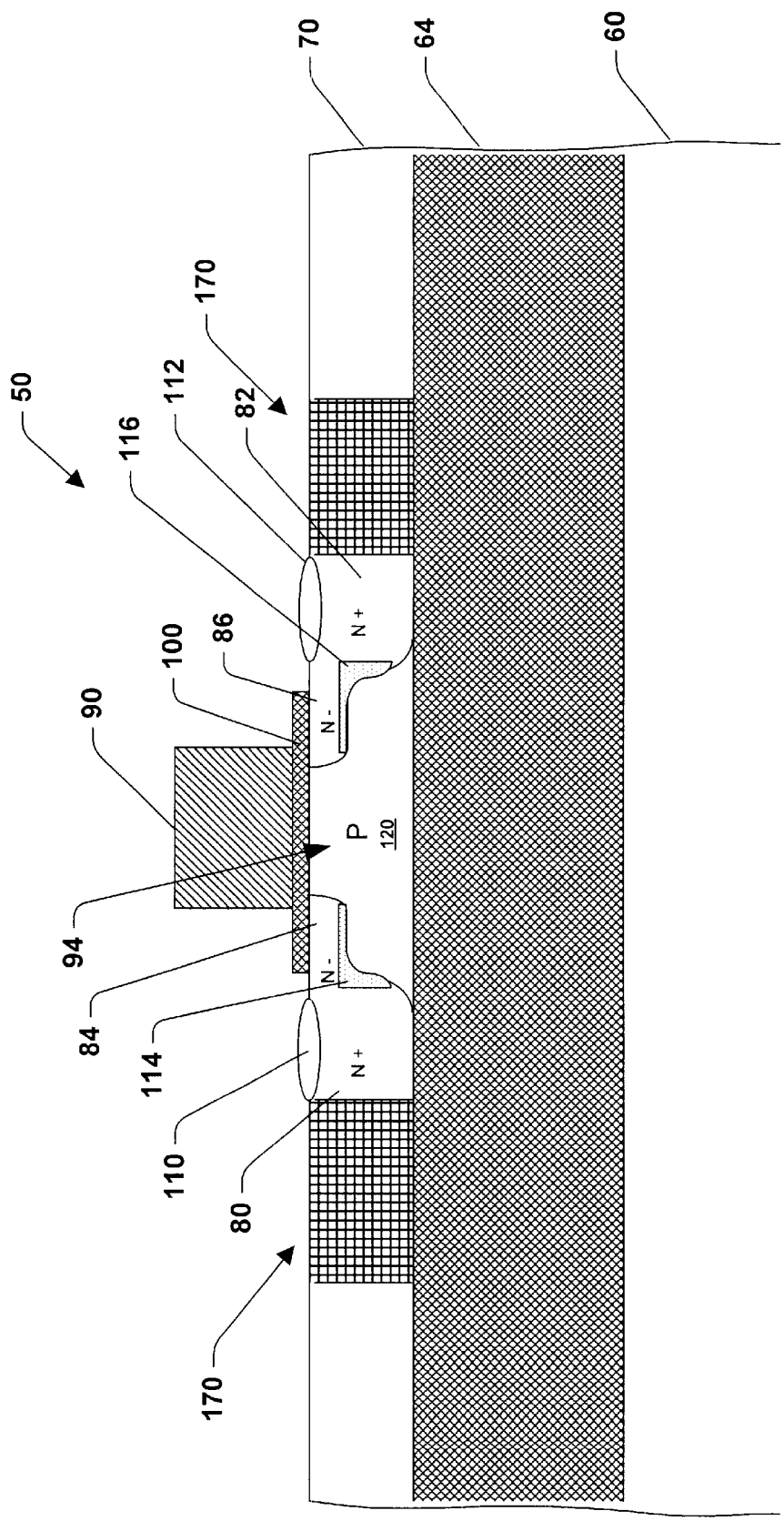
FIG. 1 illustrates an NMOS SOI structure in accordance with the present invention.

The present invention relates to a MOSFET device structure which facilitates mitigation of series resistance and floating body effects, and a method for making the same. The MOSFET device of the present invention exhibits faster performance, lower power consumption and less device hysteresis than many conventional MOSFET devices. The present invention will now be described with reference to the drawings, wherein like reference numerals are used to refer to like elements throughout. Although the present invention is described primarily in connection with an SOI MOSFET device structure, the present invention may be employed in connection with bulk MOSFET device structures as well. It should be understood that the description of this preferred embodiment is merely illustrative and that it should not be taken in a limiting sense.

FIG. 1 is a schematic cross-sectional illustration of an SOI MOSFET device structure 50 in accordance with the present invention. The device structure 50 includes a base 60 comprising silicon, for example. The base 60 provides mechanical support for the device structure 50, and is of a thickness suitable for providing such support. A dielectric layer 64 (e.g., SiO$_2$, Si$_3$N$_4$) is formed over the base 60. The thickness of the dielectric layer 64 is preferably within the range of 1000 Å to 5000 Å. A top silicon layer 70 is shown formed over the dielectric layer 64, and the top silicon layer preferably has a thickness within the range of 500 Å to 2000 Å. The top silicon layer 70 becomes the active region for device fabrication.

The device structure 50 is an NMOS type device and further includes an N$^+$ source region 80, an N$^+$ drain region 82, an N$^-$ lightly doped source extension region 84, and an N$^-$ lightly doped drain extension region 86. The device structure 50 includes a gate 90 and a p-type channel 94, and a gate oxide layer 100 formed between the gate 90 and the channel 94.

Above the source region 80 is a source silicide film region 110 and above the drain region is a drain silicide film region 112. The area under the channel 94 and between the source/drain extension regions 84, 86 is a p-type body 120. As noted above, the silicide regions 110, 112 facilitate reduced series resistance of the source and the drain regions. A source damaged region 114 and a drain damaged region 116 are provided to facilitate mitigating floating body effects (e.g., kink effect and hysteresis effects) of the device 50 in addition to mitigating the effects of the source/body parasitic transistor and the drain/body parasitic transistor.

The source damaged region 114 and the drain damaged regions 116 are doped with a minority carrier lifetime reducer (MCLR). Typically, the implant is chosen from a Group VIII atomic structure such as argon, krypton or xenon. The present example utilizes argon although it is to be appreciated that alternative implants can be employed including those outside the Group VIII atomic structure. The damaged regions 114 and 116 enhance the rate of removal of excess carriers (increasing the recombination of the body/source junction and the body/drain region by providing a smaller barrier for holes to be removed from the body 120) and ultimately minimizing floating body effects.

In one specific embodiment of the present invention, the lightly doped source/drain extension regions include an arsenic implant having a dose concentration in the range of $1 \times 10^{14}$ to $1 \times 10^{16}$ atoms/cm$^2$ and implanted at an energy range of about 1 KeV to about 100 KeV. Arsenic is employed to make a substantially shallow junction because of its heavy nature and less tendency to move. Of course it will be appreciated that any suitable dose and energy range and implant may be employed to carry out the present invention. The p-type body 120 includes a P$^+$ implant (e.g., boron) having a dose within the range of $1 \times 10^{10}$ to $1 \times 10^{14}$ atoms/cm$^2$.

Figure 2:
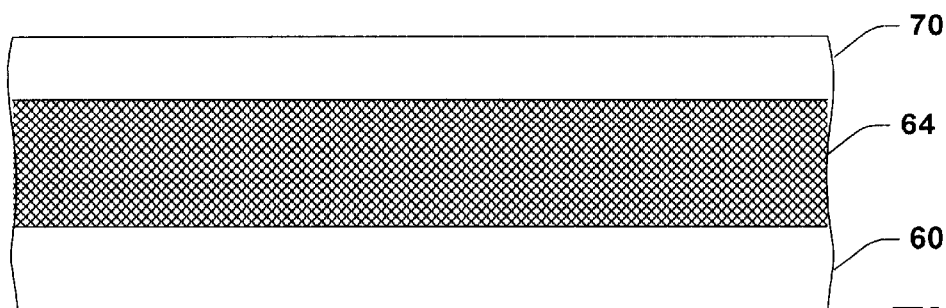
FIG. 2 is a schematic cross-sectional illustration of an SOI substrate in accordance with the present invention.

Turning now to FIGS. 2–18, fabrication steps in connection with forming the structure 50 of FIG. 1 are discussed. FIG. 2 illustrates a basic SOI structure in its early stages of fabrication. The structure includes the silicon base 60, the silicon oxide layer 64 and the top silicon layer 70. This basic structure is formed preferably via a SIMOX (Separation by Implantation of Oxygen) process. The basic steps of the SIMOX process involve implanting oxygen beneath the surface of a silicon wafer. An annealing step is next performed to coalesce the implanted oxygen atoms into a uniform layer of SiO$_2$. Sometimes, epitaxial silicon may be grown atop the silicon to satisfy specific device requirements, but with or without an epitaxial layer, the top surface film 70 becomes the active region for device fabrication. The buried oxide layer 64 is typically 0.1 to 0.5 μm thick and exhibit almost complete incorporation of the implanted oxygen. Typical implant energies range from 150 to 200 keV, while the oxygen dose may vary from 1 to 2E18 cm$^{-2}$. The top silicon film 70 thickness as well as the variation thereof with respect to the oxide layer 64 thickness is a function of the implant energy as well as the rate of surface silicon sputtering during the implant process.

A second step in the SIMOX process is high temperature annealing. Such annealing is typically performed at temperatures greater than 1250° C. for several hours to coalesce the implanted oxygen and achieve solid state recrystallization of the top (superficial) silicon layer 70 from the surface downward.

FIGS. 3–9 illustrate process steps associated with fabrication of isolation regions of the MOSFET device 50 (FIG. 1) in accordance with the present invention. The present process relates to shallow trench isolation (STI), which involves etching a trench into the top silicon layer 70 and filling the trench with an isolation material. Local oxidation of silicon (LOCOS) isolation processes generally occupy a great deal of wafer surface area, and thus STI provides for an alternative isolation technique.

Figure 3:
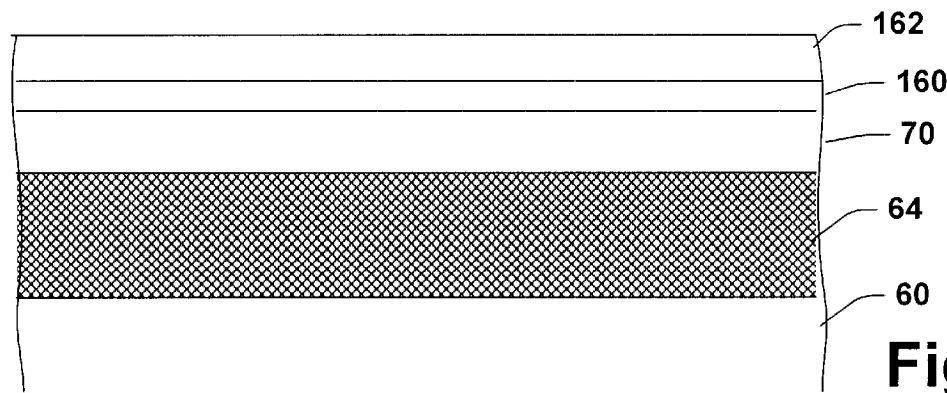
FIG. 3 is a schematic cross-sectional illustration of the SOI substrate of FIG. 2 with a pad oxide layer and nitride layer formed thereon in accordance with the present invention.
Figure 4:
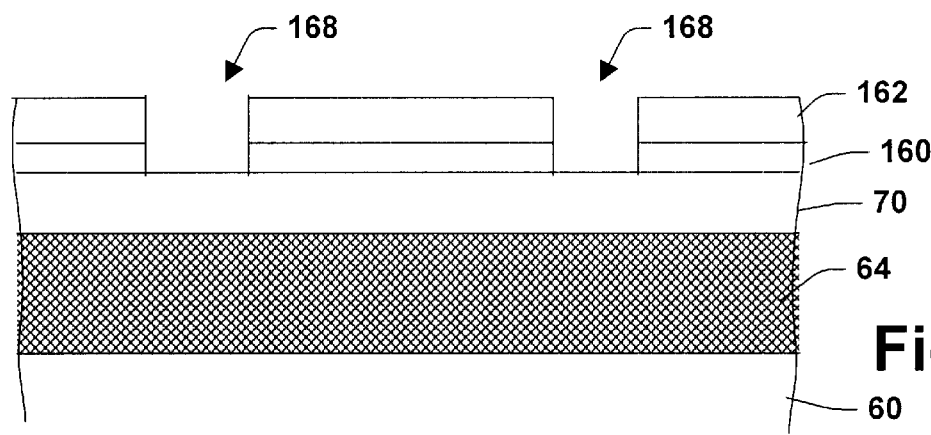
FIG. 4 is a schematic cross-sectional illustration of the structure of FIG. 3 with isolation regions formed therein in accordance with the present invention.

FIG. 3 illustrates a pad oxide layer 160 and a layer of nitride 162 formed on the surface of the top silicon layer 70. The pad oxide layer 160 has a thickness of approximately 200 Å and may be thermally grown at a temperature of approximately 900° C. for a period of 40 minutes. The nitride layer 162 is deposited on the surface of the pad oxide layer 160 via a chemical vapor deposition (CVD) process to a thickness of approximately 2000 Å. A conventional photoresist process is then utilized to pattern and etch the nitride layer 162 and the pad oxide layer 160 in order to result in the structure shown in FIG. 4. Such photoresist process includes use of an STI mask which defines isolation regions 168.

Figure 5:
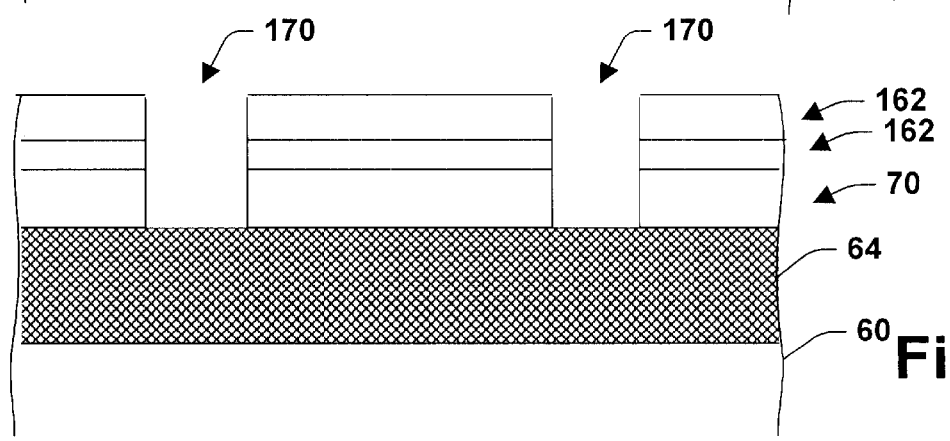
FIG. 5 is a schematic cross-sectional illustration of the structure of FIG. 4 with shallow isolation trenches formed at the isolation regions in accordance with the present invention.

Next, as represented in FIG. 5, a silicon etch is performed so as to form shallow trenches 170 within the top silicon layer 70 at the isolation regions 168. In particular, a trench resist material (not shown) is applied to cover the structure and is then patterned to expose the isolation regions 168. The shallow trenches 170 are then etched into the top silicon layer 70 using suitable techniques. The trench resist material is thereafter stripped so as to result in the structure shown in FIG. 5.

Figure 6:
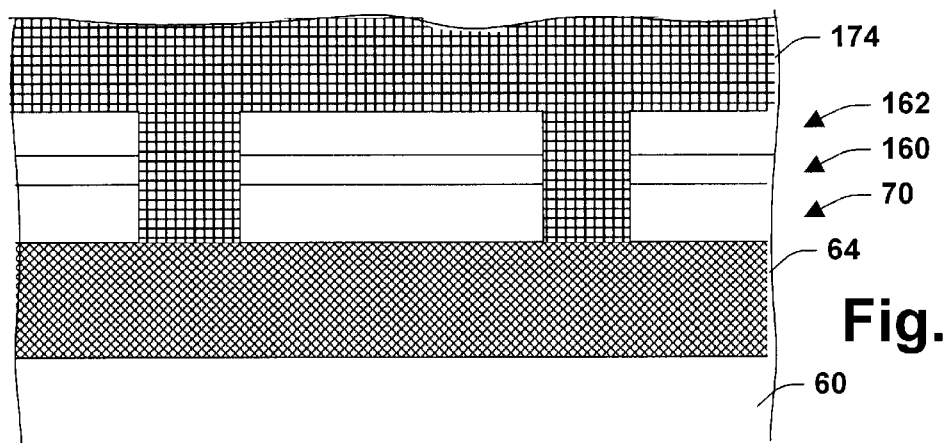
FIG. 6 is a schematic cross-sectional illustration of the structure of FIG. 5 with an oxide layer formed thereon so as to fill the isolation trenches in accordance with the present invention.
Figure 7:
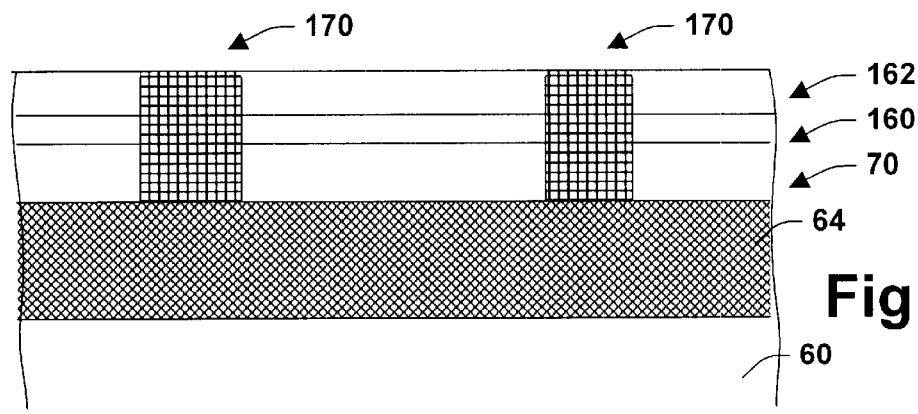
FIG. 7 is a schematic cross-sectional illustration of the structure of FIG. 6 after the oxide layer has been polished down to the surface of the nitride layer in accordance with the present invention.

Following the formation of the trenches 170 via the silicon etch, a layer of oxide material 174 is formed on the structure using high density plasma chemical vapor deposition (HDPCVD) in order to fill fully the isolation regions 170 with the oxide material 174 as shown in FIG. 6. As is known, HDPCVD is a self-planarizing process which facilitates reduction of the chemical mechanical polishing (CMP) times required in subsequent steps. (See, e.g., Pye, J. T. et al., *High-density plasma CVD and CMP for 0.25-µm intermetal dielectric processing*, Solid State Technology, Dec. 1995, pgs. 65–71). Following deposition of the oxide material 174, the oxide material 174 is polished via CMP down to the surface level of the nitride layer 162 as shown in FIG. 7. Consequently, the insulative oxide material 174 in the trenches 170 remains. The upper surface of the oxide material 174 is substantially even with the upper surface of the nitride layer 162.

Figure 8:
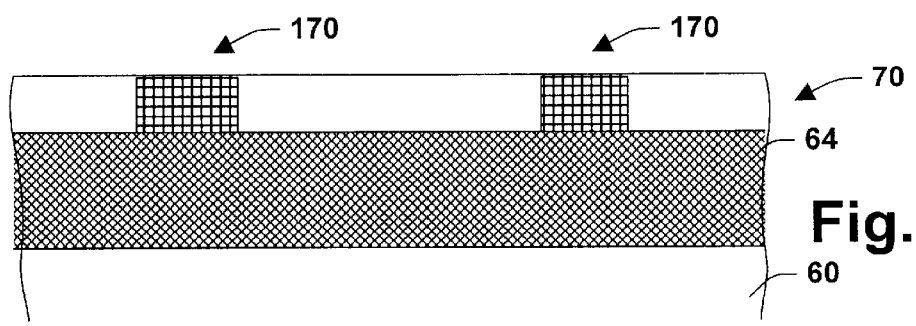
FIG. 8 is a schematic cross-sectional illustration of the structure of FIG. 7 after the nitride layer, pad oxide layer and portions of the oxide layer have been etched away in accordance with the present invention.

As is represented in FIG. 8, the nitride layer 162 and pad oxide layer 160 are stripped away using a suitable stripping process. The strip process also results in the top surface of the oxide material 174 being etched to a level substantially even with the surface of the top silicon layer 70. Thus, the formation of the shallow isolation trenches 170 is substantially complete in relevant part.

Turning now to FIGS. 9–18, process steps in connection with completion of the MOSFET device 50 in accordance with the present invention are described. Although the present invention is described in the context of fabricating an NMOS type device it is to be appreciated that the present invention as applicability to a variety of transistor devices. The present description will enable those skilled in the art to practice the invention with respect to a vast number of different types of transistor devices which are intended to fall within the scope of the invention as defined by the hereto appended claims.

Figure 9:
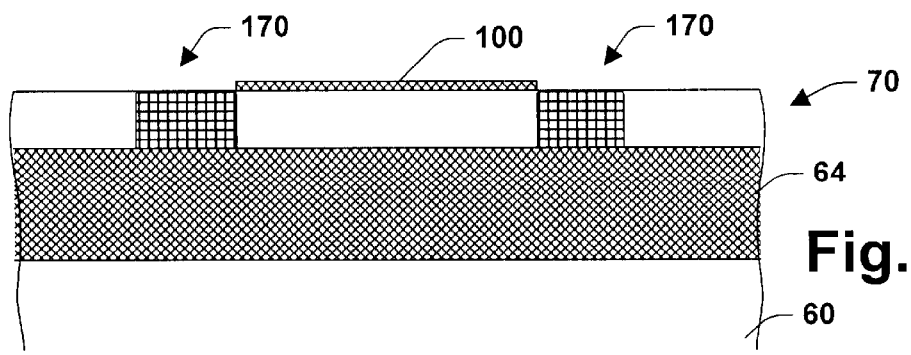
FIG. 9 is a schematic cross-sectional illustration of the structure of FIG. 8 with a thin low dielectric constant gate oxide material formed on the substrate surface between the isolation trenches in accordance with the present invention.
Figure 10:
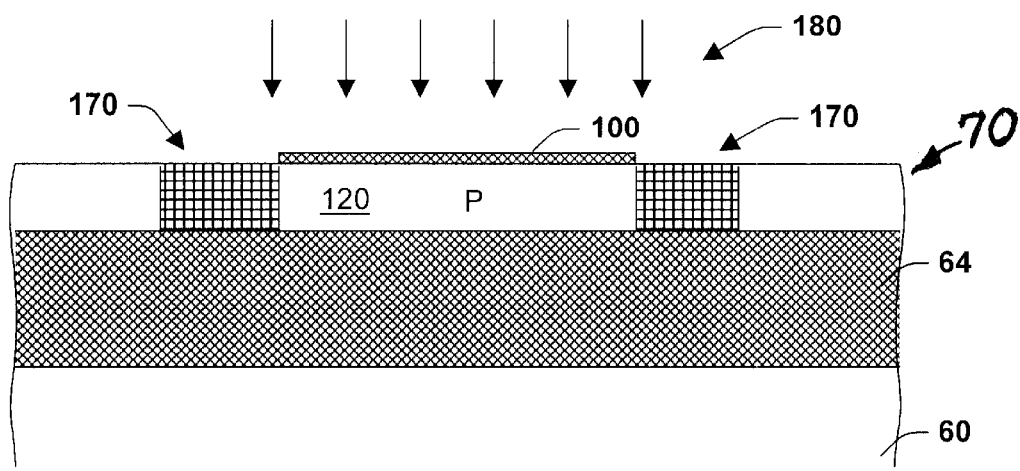
FIG. 10 is a schematic cross-sectional illustration of the structure of FIG. 9 undergoing an ion implant step to form a p-type body region in accordance with the present invention.

FIG. 9 illustrates the thin gate oxide material 100 (FIG. 1) being laid down on the top silicon layer 70 between the shallow trenches 170. The thin gate oxide material 100 is formed to have a thickness within the range of about <40 Å. Preferably, the thin gate oxide material 100 includes $SiO_2$ which has a substantially low dielectric constant. However, it is to be appreciated that any suitable material (e.g., $Si_3N_4$) for carrying out the present invention may be employed and is intended to fall within the scope of the present invention. The top silicon layer 70 is of a p-type and the trenches 170 serve as isolation barriers to define active regions. FIG. 10 shows the formation of the p-type body 120 by masking a portion of the top silicon layer 70 with a photoresist layer (not shown) and implanting p-well dopants 180 to provide the p-type body 120.

Figure 11:
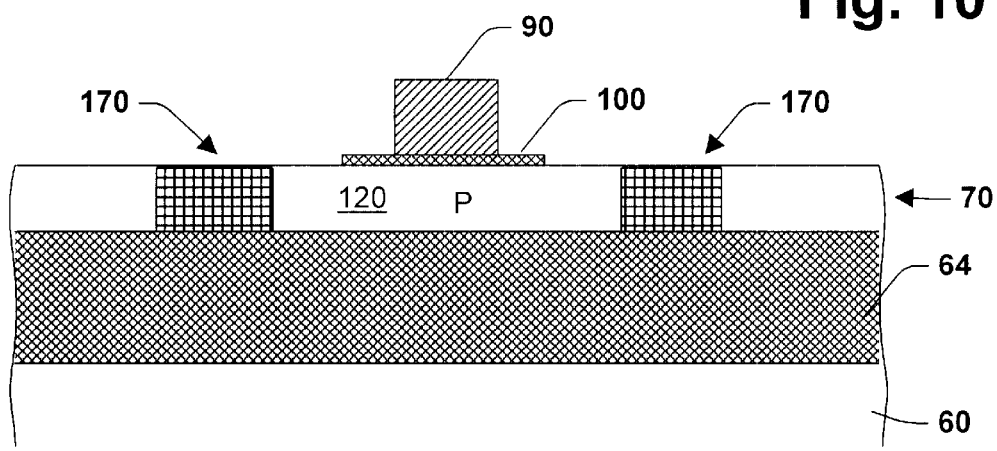
FIG. 11 is a schematic cross-sectional illustration of the structure of FIG. 10 after formation of a gate in accordance with the present invention.

Thereafter as shown in FIG. 11 the gate 90 is formed between the shallow trenches 170 over the thin gate oxide material 100. The gate 90 is made of polysilicon. The gate 90 has a thickness within the range of about 1000 to 2000 Å, and the thickness of the gate 90 is chosen so as to account for any subsequent polishing that might be performed. It will be appreciated of course that the thickness of the thin gate oxide material 100 and the gate 90 may be tailored as desired and the present invention intends to include any suitable range of thicknesses thereof for carrying out the present invention. Excess gate oxide material 100 is removed as is conventional.

Figure 12:
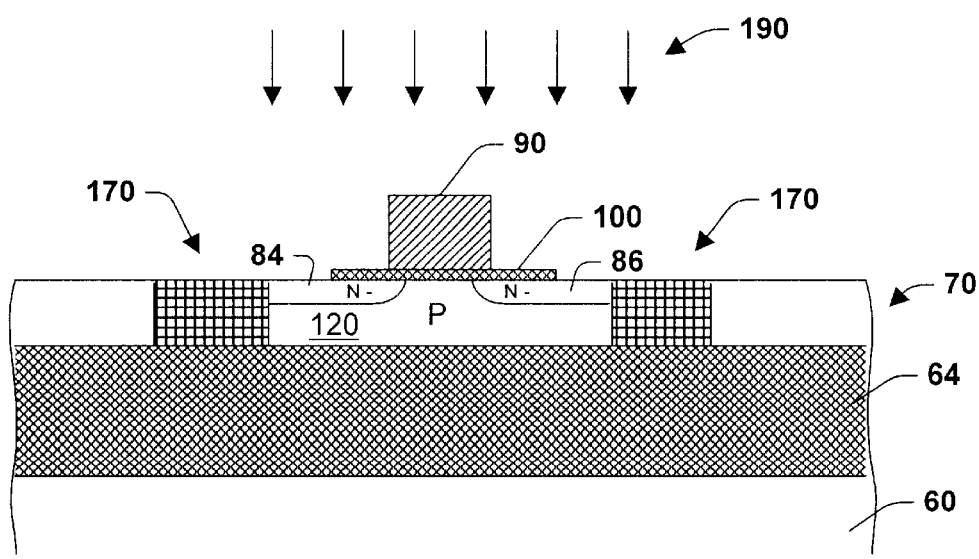
FIG. 12 is a schematic cross-sectional illustration of the structure of FIG. 11 undergoing an ion implant step to form $N^-$ source/drain (S/D) lightly doped regions in accordance with the present invention.

FIG. 12 illustrates an n-region first ion implant step. An $N^-$ implant 190 is used to form n-channel transistor lightly doped regions 84 and 86 which are self-aligned with the gate 90. In the preferred embodiment, this implant step may be an arsenic implant for example having a dose in the range of $1 \times 10^{14}$ to $1 \times 10^{16}$ atoms/cm$^2$ and an energy range of about 1 KeV to about 100 KeV. Arsenic is employed to make a substantially shallow junction because of its heavy nature and less tendency to move. Of course it will be appreciated that any suitable dose and energy range and implant may be employed to carry out the present invention.

Next, after the step of implanting arsenic, an optional nitrogen implant step may be performed as part of implant step 190. Nitrogen may be added via implantation in the lightly doped regions 84 and 86. The nitrogen implant may be applied at a dose of $1 \times 10^{14}$ to $5 \times 10^{15}$ atoms/cm$^2$ with an energy range of about 1 KeV to 100 KeV. It will be appreciated that although in the preferred embodiment the nitrogen implant step is performed after the arsenic implantation, the nitrogen implantation may be performed prior to the arsenic implantation.

The implantation of the nitrogen as represented results in reduced series resistance and hot carrier effects without significantly increasing S/D extension overlap. Contrary to conventional MOS fabrication techniques where increasing dopant concentration results in lower sheet resistance, the nitrogen implantation does not result in a deeper junction as a result of the increase in dopant. On the other hand, if the arsenic dopant dose is increased in order to lower sheet resistance, a deeper junction would result. The deeper junction may result in bad roll-off, make the MOS device more difficult to control, and possibly result in punch through effects. The implantation of nitrogen avoids these negative effects because the nitrogen does not increase the depth of the junction which is typically the case with conventional n-type dopants such as arsenic. However, unlike conventional techniques, the nitrogen implantation results in reduced series resistance. Thus, this step provides for reducing series resistance without the negative consequences (e.g., hot electron carrier and punch through effects) associated with conventional techniques.

Furthermore, the nitrogen implantation does not result in any significant increase in the amount of diffusion of the S/D extension into the gate. When an implant is provided in the S/D extension region the implant not only spreads vertically there is also horizontal spreading of the implant which is known as S/D extension overlap into the gate. The use of nitrogen implant does not result in any significant increase in S/D extension overlap as compared to conventional dopants.

Figure 13:
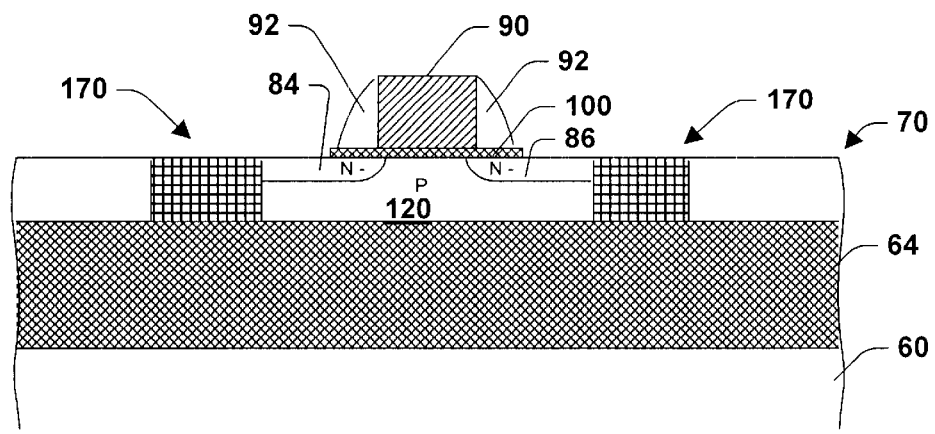
FIG. 13 is a schematic cross-sectional illustration of the structure of FIG. 12 after the formation of spacers in accordance with the present invention.

After the implant step 190, the spacers 92 are formed along sidewalls of the gate 90. To accomplish this step, a spacer material layer (not shown) may be formed over the top silicon layer 70. The spacer material layer may be formed by depositing tetraethoxysilane (TEOS) oxide, silicon dioxide or the like over the surface of the top silicon layer 70. The spacer material is then anisotropically etched to form the spacers 92 on the sidewalls of the gate 90, for example. An etchant which selectively etches the spacer material layer (e.g., etches the spacer material layer at a faster rate than the top silicon layer 70), may be used to etch the spacer material layer until only the spacers 92 remain at the sidewalls of the gate 90 as shown in FIG. 13.

Figure 14:
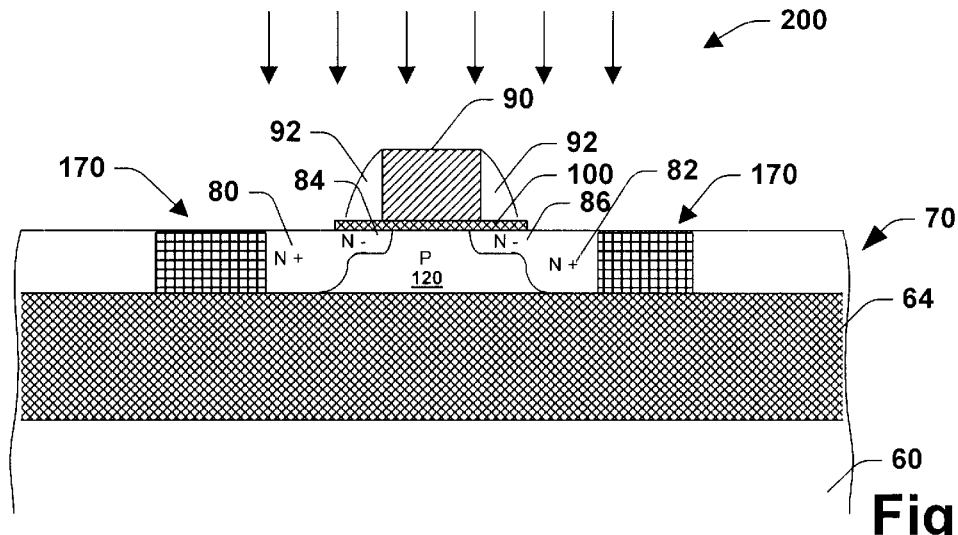
FIG. 14 is a schematic cross-sectional illustration of the structure of FIG. 13 undergoing an ion implant step to form source and drain regions in accordance with the present invention.

After the formation of the spacers 92 another ion implant step 200 is performed as shown in FIG. 14. An $N^+$ implant is performed in step 200 to form $N^+$ source region 80 and $N^+$ drain region 82 in portions of the lightly doped regions, respectively. The spacers 92 serve as masks to prevent ion implantation in the portions of lightly doped regions underlying the spacers 92. These protected portions of the lightly doped regions are the respective lightly doped source (LDS) region 84, lightly doped drain (LDD) region 86 of the n-channel device 50. As the doping concentration of the source/drain regions is decreased, although the junction capacitance decreases, the resistivity of the source/drain regions increase which can cause the transistor to slow down. It is believed that between source/drain dopant concentrations of $10^{17}/cm^3$ and $10^{20}/cm^3$, however, that an optimal point exists where the low junction capacitance best compensates for the increased source/drain resistance. The optional nitrogen implant step discussed above may be employed to mitigate increased resistivity.

Figure 15:
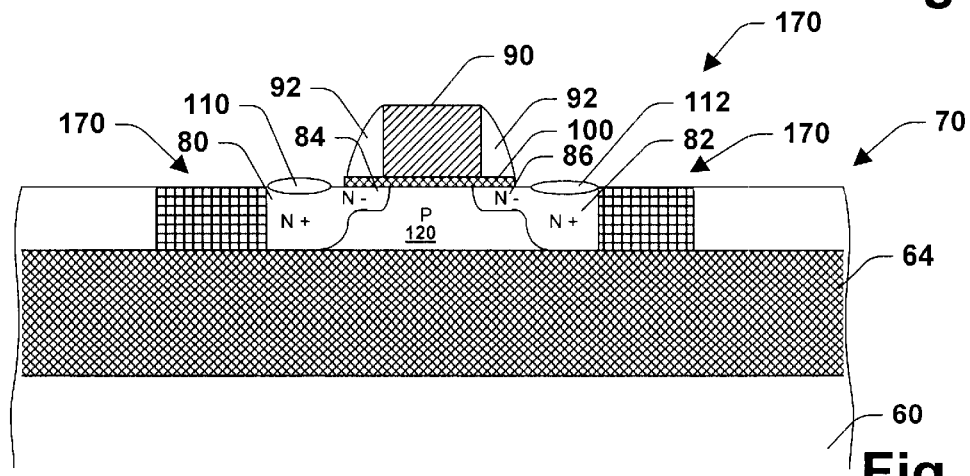
FIG. 15 is a schematic cross-sectional illustration of the structure of FIG. 14 after formation of a thin silicide film over the drain and source regions over the structure in accordance with the present invention.
Figure 16:
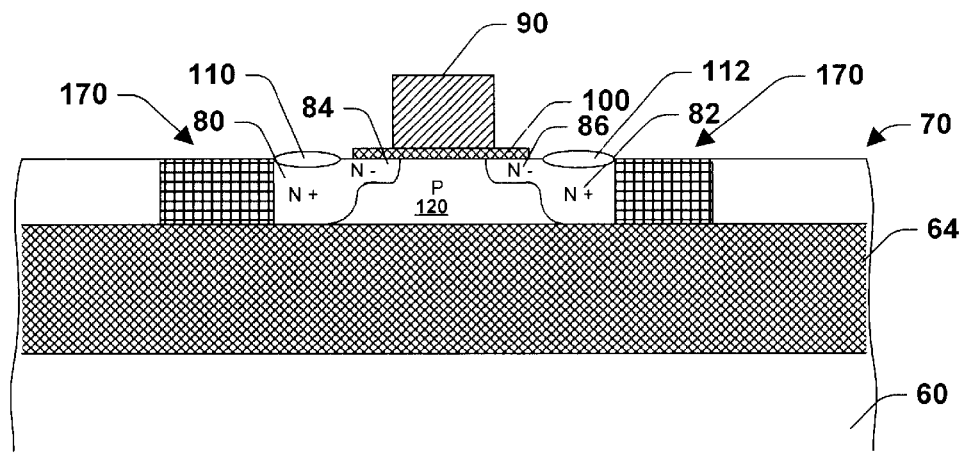
FIG. 16 is a schematic cross-sectional illustration of the structure of FIG. 15 after removal of the spacers in accordance with the present invention.
Figure 17:
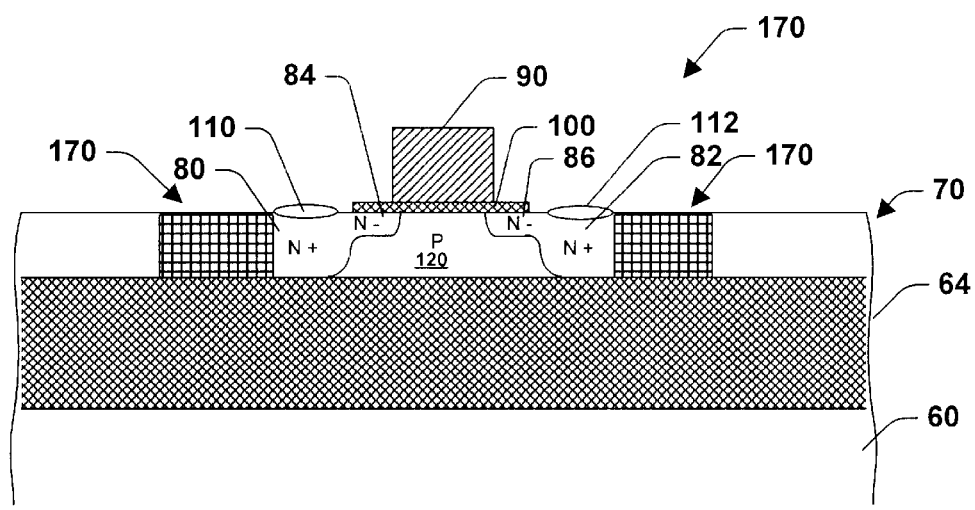
FIG. 17 is a schematic cross-sectional illustration of the structure of FIG. 16 undergoing an ion MCLR implant step to form damaged regions in accordance with the present invention.
Figure 18:
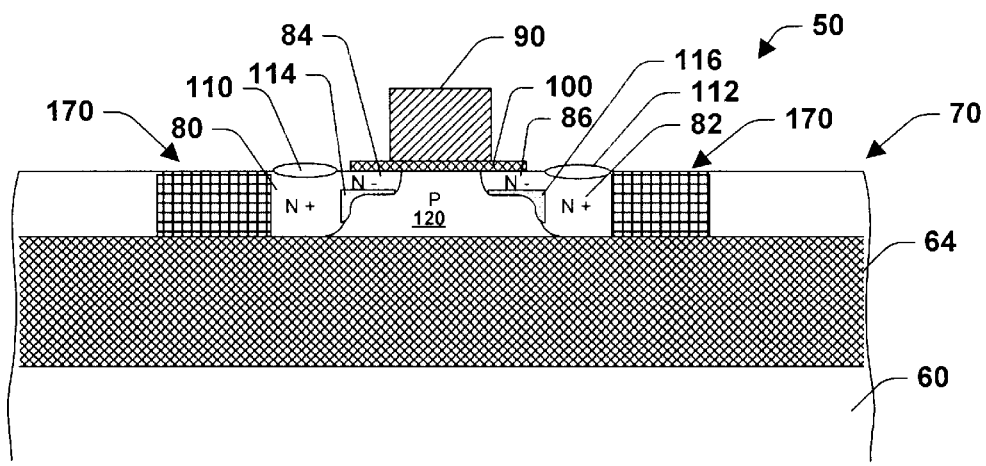
FIG. 18 is a schematic cross-sectional illustration of the structure of FIG. 17 after the damaged regions have been formed in accordance with the present invention.

Turning now to FIG. 15, a source silicide film 110 and a drain silicide film 112 are formed over source 80 and drain 82, respectively. The silicide film 110, 112 reduces series resistance of the source 80 and drain 82 regions. The spacers 92 are then removed resulting in the structure illustrated in FIG. 16. FIG. 17 illustrates an argon ion implant step 210 wherein the source silicide film 110 and the drain silicide film 112 function as a natural mask. This implant 210 may have a dose in the range of $1\times10^{18}$ to $1\times10^{19}$ atoms/cm$^2$ and an energy range of about 1 KeV to about 200 KeV. Of course it will be appreciated that any suitable dose and energy range and implant may be employed to carry out the present invention. The argon ion implant step 210 forms a source damaged region 114 along the source body junction and a drain damaged region 116 along the drain body junction as illustrated in FIG. 18. The damaged regions mitigate the effects from the parasitic transistors formed between source and body junction and the drain and body junction.

Substantially the same fabrication methodology may be employed in the fabrication of such an n-channel device as a bulk device as compared to the discussed SOI type device. One skilled in the art could readily tailor the above steps to form such n-channel devices based on the discussion herein, and therefore further discussion related thereto is omitted for sake of brevity.

What has been described above are preferred embodiments of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A MOSFET device, comprising:
   a source region;
   a drain region;
   first lightly doped regions, the first lightly doped regions including a lightly doped source extension region and a lightly doped drain extension region; and
   at least one damaged sidewall region at one of a source body junction and a drain body junction, the source body junction and drain body junction comprising respective portions of source or drain regions and respective portions of source or drain extension regions.

2. The device of claim 1, including at least one silicide film layer disposed above and adjacent to the at least one damaged side wall region.

3. The device of claim 1, including a source damage region at the sidewall region of the source body junction and a drain damage region at the sidewall region of the drain body junction.

4. The device of claim 3, including a source silicide film layer disposed over the source region and a drain silicide layer over the drain region.

5. The device of claim 4, the at least one damaged sidewall region being formed from an implant of one of argon, krypton and xenon.

6. The device of claim 5, the silicide layer forming a mask during the implant of one of argon, krypton and xenon.

7. The device of claim 1, the device including an SOI substrate, and the at least one damaged sidewall region facilitating mitigation of floating body effects in the device.

8. The device of claim 1, the device being a bulk type device.

9. An SOI NMOS device, comprising:
   a silicon substrate;
   an insulating oxide layer formed over the substrate;
   a top silicon layer formed over the insulating oxide layer;
   a gate formed over a portion of the top silicon layer;
   a gate oxide formed between the gate and the top silicon layer;
   $N^+$ source and $N^+$ drain regions formed in the top silicon layer;
   $N^-$ lightly doped source and drain extension regions formed in the top silicon layer;
   source damaged regions and drain damaged regions formed in sidewalls of the $N^+$ source and $N^+$ drain regions, respectively, and along a portion of the lightly doped source and drain extension regions, respectively;
   source silicide film and drain silicide film layer formed over the $N^+$ source and $N^+$ drain regions, respectively; and
   wherein the source silicide film and drain silicide film layer facilitate mitigating series resistance in the source and drain regions and the source damaged regions and drain damaged regions facilitate mitigating floating body effects.

10. A method of forming a MOSFET device, comprising the sequential steps of:
    forming a source region;
    forming a drain region;
    forming first lightly doped regions, the first lightly doped regions including a lightly doped source extension region and a lightly doped drain extension region; and
    forming at least one damaged sidewall region at one of a source body junction and a drain body junction, the source body junction and drain body junction comprising respective portions of source or drain regions and respective portions of source or drain extension regions.

11. The method of claim 10, including the step of forming at least one silicide film layer disposed above and adjacent to the at least one damaged side wall region.

12. The method of claim 10, including the step of forming a source damage region at the sidewall region of the source body junction and a drain damage region at the sidewall region of the drain body junction.

13. The method of claim 12, including the step of forming a source silicide film layer disposed over the source region and a drain silicide layer over the drain region.

14. The method of claim 13, including the step of forming the at least one damaged sidewall region being formed from an implant of one of argon, krypton and xenon.

15. The method of claim 14, including the step of the silicide layer forming a mask during the implant of one of argon, krypton and xenon.

16. A method of forming an SOI NMOS transistor, comprising the steps of:

forming a silicon substrate;

forming an insulating oxide layer formed over the substrate;

forming a top silicon layer formed over the insulating oxide layer;

forming a gate formed over a portion of the top silicon layer;

forming a gate oxide formed between the gate and the top silicon layer;

forming $N^+$ source and $N^+$ drain regions formed in the top silicon layer;

forming $N^-$ lightly doped source and drain extension regions formed in the top silicon layer;

forming source damaged regions and drain damaged regions formed in sidewalls of the $N^+$ source and $N^+$ drain regions, respectively, and along a portion of the lightly doped source and drain extension regions, respectively;

forming source silicide film and drain silicide film layer formed over the $N^+$ source and $N^+$ drain regions, respectively; and wherein the source silicide film and drain silicide film layer facilitate mitigating series resistance in the source and drain regions and the source damaged regions and drain damaged regions facilitate mitigating floating body effects.

17. The method of claim 10, including the step of providing an SOI substrate, and the at least one damaged sidewall region facilitating mitigation of floating body effects in the device.

18. The method of claim 10, the device being a bulk type device.

* * * * *